United States Patent
Abedifard et al.

(10) Patent No.: US 8,693,240 B1
(45) Date of Patent: Apr. 8, 2014

(54) METHOD AND APPARATUS FOR READING A MAGNETIC TUNNEL JUNCTION USING A SEQUENCE OF SHORT PULSES

(71) Applicant: Avalanche Technology, Inc., Fremont, CA (US)

(72) Inventors: Ebrahim Abedifard, Sunnyvale, CA (US); Parviz Keshtbod, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/688,066

(22) Filed: Nov. 28, 2012

(51) Int. Cl.
*G11C 11/00* (2006.01)

(52) U.S. Cl.
USPC .......................................... 365/158

(58) Field of Classification Search
USPC .......................................... 365/158
See application file for complete search history.

(56) References Cited

U.S. PATENT DOCUMENTS 7,852,665 B2 * 12/2010 Chen et al. ..................... 365/158

* cited by examiner

*Primary Examiner* — Anthan Tran
(74) *Attorney, Agent, or Firm* — Maryam Imam; IPxLAW Group LLP

(57) ABSTRACT

A magnetic random access memory (MRAM) array having a magnetic tunnel junction (MTJ) to be read using a magnetic state of the MTJ, the MTJ being read by applying a current therethrough. Further, the MRAM array has a reference MTJ, a sense amplifier coupled to the MTJ and the reference MTJ, the sense amplifier operable to compare the voltage of the MTJ to the reference MTJ in determining the state of the MTJ; a first capacitor coupled to the sense amplifier at a first end and to ground at a second end; and a second capacitor coupled to the sense amplifier at a first end and to ground at a second end, the first capacitor storing the, wherein short voltage pulses are applied to the first end of each of the first and second capacitors when reading the MTJ thereby makes the current flowing through the MTJ therethrough for small time intervals thereby avoiding read disturbance to the MTJ.

12 Claims, 2 Drawing Sheets

METHOD AND APPARATUS FOR READING A MAGNETIC TUNNEL JUNCTION USING A SEQUENCE OF SHORT PULSES

BACKGROUND OF THE INVENTION

1. Field of the Invention

This invention relates generally to magnetic tunnel junctions (MTJs) and particularly to reading MTJs.

2. Description of the Prior Art

Magnetic random access memory (MRAM) is foreseen as a candidate for many applications in the coming years. Its non-volatility is attributed to a magnetic tunnel junction (MTJ) making up the primary component of the MRAM because its magnetic orientation switches to save data. However, to gain further acceptance, MTJs must be made to scale.

Currently, programming of the MTJ is achieved by the application of a current through the MTJ for the time duration of 't'. For times larger than 5 nano-seconds (ns), the relationship between programming current and time is logarithmic. This region is commonly referred to as the "thermally activated region". Below 5 ns, the programming current is almost proportional to T, and this region is commonly referred to as the "processional switching region".

As the size of the MTJ scales down, which is required for many applications employing high-capacity non-volatile memory, the programming current required for programming or writing to the MTJ decreases. Normally the current required for reading an MTJ is a small fraction of the program current. This is needed to prevent accidentally programming the MTJ during the read operation and is commonly referred to as "read disturbance". Read disturbance obviously leads to defective MRAMs and can not be tolerated. With the MTJ scaling to small sizes, the required programming current goes down, which increases the probability of read disturbance. At the same time for larger and faster dice, the read current requirements increase. At some point, these two competing requirements make it difficult to prevent read disturbance leading to unintentional programming during read operations and therefore unreliability of the memory.

What is needed is a magnetic random access memory (MRAM) including magnetic tunnel junction (MTJ) with increased reliability particularly during reading operations.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the invention includes a magnetic random access memory (MRAM) array having a magnetic tunnel junction (MTJ) to be read using a magnetic state of the MTJ, the MTJ being read by applying a current therethrough. Further, the MRAM array has a reference MTJ, a sense amplifier coupled to the MTJ and the reference MTJ, the sense amplifier operable to compare the voltage of the MTJ to the reference MTJ in determining the state of the MTJ; a first capacitor coupled to the sense amplifier at a first end and to ground at a second end; and a second capacitor coupled to the sense amplifier at a first end and to ground at a second end, the first capacitor storing the, wherein short voltage pulses are applied to the first end of each of the first and second capacitors when reading the MTJ thereby makes the current flowing through the MTJ flow therethrough for small time intervals thereby avoiding read disturbance to the MTJ.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

Figure 1:
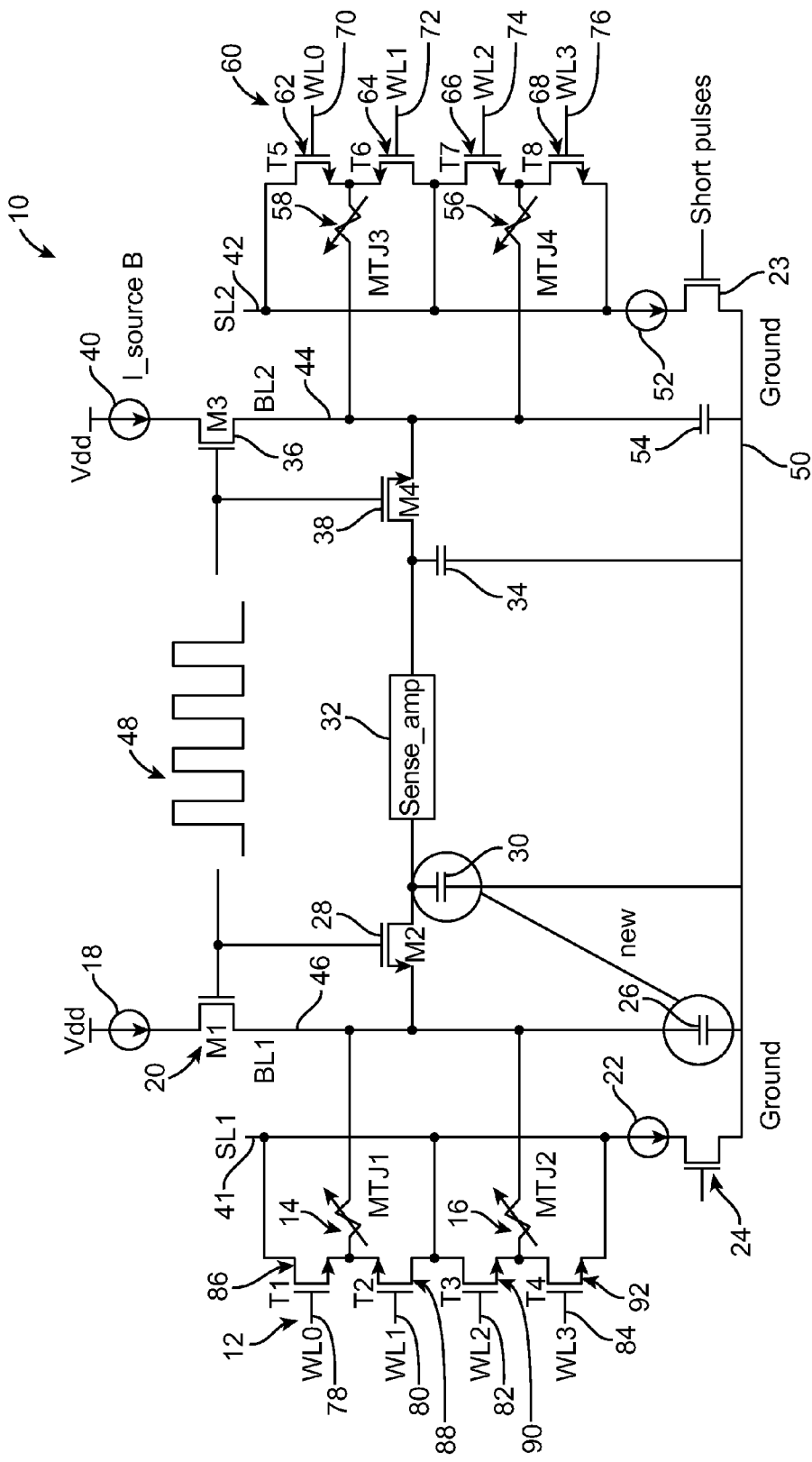
FIG. 1 shows a magnetic random access memory (MRAM) array 10, in accordance with an embodiment of the invention.

In an embodiment of the invention, such as shown in FIG. 1, a magnetic random access memory (MRAM) array 10 is shown to include magnetic tunnel junctions (MTJs) 14 and 16 and reference MTJs 58 and 56, the latter of which are used as reference MTJs during reading of the former using the remaining circuitry shown in FIG. 1, as is further discussed below. It is understood that while the array 10 is shown to include two MTJs 14 and 16 that are to be read, it may include and commonly does include additional MTJs.

The array 10 is further shown to include a sense amplifier 32, an array of access transistors 86-92, an array of reference access transistors 62-68, current sources 18, 22, 40, and 52, capacitors 26, 30, 34, and 54, and the transistors 20, 36, 28, 38, 24, and 23.

The array of transistors 86-92 is shown coupled, at each of the gates of these transistors, to the word lines 12, which is shown to include the word lines 78-84. For example, the word line (WL0) 78 is shown coupled to the gate of the transistor 78, the word line 80 (WL1) is shown coupled to the gate of the transistor 88, the word line 82 (WL2) is shown coupled to the gate of the transistor 90, and the word line (WL3) 84 is shown coupled to the gate of the transistor 92. The drain of the transistor 78 is shown coupled to a sense line (SL1) 41, which is also coupled to the drain of the transistor 82 and the source of each of the transistors 80 and 92. The drain of the transistor 84 is shown coupled to the current source 22 and the current source 22 is further shown coupled to the drain of the transistor 24. The source of the transistor 24 is shown coupled to ground. The capacitor 26 is also shown coupled to ground on one end thereof and on another end thereof, it is shown coupled to the MTJs 16 and 14 and a bit line (BL1) 46, as well as to the drain of the transistor 28 and the source of the transistor 20. The MTJ 14 is shown coupled to the drain of the transistor 86 and the drain of the transistor 88 at an end of the MTJ 14 that is opposite to the bit line 41, and the MTJ 16 is shown coupled to the drain of the transistor 90 and the source of the transistor 92 at an end of the MTJ 16 that is opposite to the bit line 41.

The source of the transistor 20 is shown coupled to the current source 18 and the current source 18 is also shown coupled to Vdd at an opposite end. The gate of the transistor 20 is shown coupled to the gate of the transistor 28, which is shown to be coupled to the sense amplifier 32 at its drain as well as to the capacitor 30. The capacitor 30 is also shown coupled to ground at an opposite end thereof. The sense amplifier 32 is shown further coupled to the capacitor 34 and to the drain of the transistor 38. The gate of the transistor 38 is shown coupled to the gate of the transistor 36. An opposite end of the capacitor 34 is shown coupled to ground. The source of the transistor 38 is shown coupled to each of the MTJs 58 and 56.

The drain of the transistor 36 is shown coupled to the current source 40 and the current source 40 is further shown coupled to Vdd, at an end opposite to the end where it is coupled to the transistor 36. The drain of the transistor 36 is shown coupled to the MTJ 58 and the MTJ 56. A source line (SL2) 42 is shown coupled to the gate of the transistor 66 and the drain of the transistor 68. A bit line (BL2) is defined at the drain of the transistor 36 and s shown coupled to the MTJ 58. An end of the MTJ 58 that is opposite to that which is coupled to the source line 42 is shown coupled to the gate of the transistor 62 and similarly, an end of the MTJ 56 that is opposite to that which is coupled to the bit line (BL2) 42 is shown coupled to the gate of the transistor 66.

The drain of the transistor 68 is shown coupled to the current source 52, which is shown coupled, at an opposite end, to the drain of the transistor 23. The source of the transistor 23 is shown coupled to ground. The source of the transistor 62 is shown coupled to the source line 42 and the gate of the transistor 62 is shown coupled to the word line (WL0) 70. The gate of the transistor 64 is shown coupled to the word linen (WL1) 72, the gate of the transistor 66 is shown coupled to the word line (WL2) 74, and the gate of the transistor 68 is shown coupled to the word line (WL3) 76. The capacitor 34 is shown coupled at one end to the sense amplifier 32 and at another end to the source of the transistor 38. The drain of the transistor 38 is shown coupled to the bit line 44.

In operation, the MTJs 14 and 16 are programmed and/or read using their counterpart reference MTJs 58 and 56, respectively, as is well known in the art. It is also well known in the art that the access transistors 86-92 and 62-68 use are used to access the foregoing MTJs for programming and reading operations. Similarly known is the word lines 78-84 serve to select the MTJ to be read and/or written to, i.e. the MTJs 14 and 16. In this respect, in some embodiments, the word line that is used to select one of the MTJs 14 and 16 is also used to select one of the counterpart reference MTJs 58 and 56, accordingly, for example, the word line 78 is the same as the word line 70, the word line 80 is the same as the word line 72, the word line 82 is the same as the word line 74, and the word line 84 is the same as the word line 76.

Typically, during a read operation, current flows from the current source 18 through the transistor 20 and through the MTJ being read, such as either the MTJ 14 or the MTJ 16. The selection of which of these MTJs is made by the state of a respective word line and access transistor. Upon flowing through the MTJ that is being read, current flows through the transistor 28.

Similarly, in the reference path, shown generally on the right side of the FIG. 1, current flows from the current source 40 through the transistor 36 and through the corresponding reference MTJ, such as either the MTJ 58 or the MTJ 56. The selection of which of these MTJs is made by the state of a respective word line and access transistor. Upon flowing through the MTJ that is being read, current flows through the transistor 38.

A sequence of voltage pulses, such as that which is shown at 48 in FIG. 1, are applied to the gate of the transistor 28, the gate of the transistor 38, the gate of the transistor 24, and the gate of the transistor 23 as well as transistors 20 and 36. These short pulses are small and during a read operation, help to ensure that the MTJs 14 and 16 are operating in the "processional switching" region, as will be further discussed with reference to FIG. 2 below. Being in the processional switching region requires very high programming current to be applied to the MTJs 14 and 16 before they can actually be programmed or written to. Accordingly, the possibility of accidental programming and therefore read disturbance is minimized or eliminated.

An example of the short pulses at 48 is 0.5 to 1.5 nano seconds per pulse.

The capacitor 30 serves to store and accumulate the voltage at the left side of the sense amplifier 32 when the MTJ 14 is being read and the capacitor 34 serves to store and accumulate the voltage at the right side of the sense amplifier 32 when the reference MTJ 58 is being read during the read operation of the MTJ 14. Similarly, the capacitor 26 serves to store and accumulate the voltage at the left side of the sense amplifier 32 The charges on the caps 26 and 54 are discharged intermittently through the MTJs and current sources, while charges on Caps 30 and 34 accumulate charge and consequently voltage depending on the resistances of the MTJs 14 and 58.

In an example, one of the MTJs 14 or 16 and its counterpart reference MTJ are selected for reading. In this example, the reference MTJ is presumed programmed high while the counterpart MTJ being accessed for reading is presumed programmed low. The current sources 18 and 40 pump current into the bit lines 46 and 44. The word line (for example WL0) 78 is high. The currents through the two MTJs are interrupted by pulsing the gates of the pass transistors 20, 28, 36, and 38. This makes the current through the MTJs only flow for small time intervals, for example 0.5 to 1.5 ns and reduces the programming chance and read disturbance. As currents flow into the bit line, the voltage on the bit lines will rise, which in turn help to rise the voltages on Caps 30 and 34, at the same time the two MTJs drain the current, but since the resistances of the two MTJs are different, the voltages rise differently allowing the sense amplifier 32 to sense the state of the MTJ being read.

It is understood that each MTJ is a part of a MRAM that may have layers such as a barrier layer, a fixed layer, a free layer, and other layers, as well know in the art.

In summary, in FIG. 1, the MRAM array 10, through the current source 18, applies a current to the MTJ 14 and through the current source 40 to the reference MTJ 58. The sense amplifier 32 compares the voltage of the MTJ 14 to that of the reference MTJ 58 in determining the state of the MTJ 14. The sequence of short voltage pulses, such as shown at 48, are accumulated by the capacitors 30 and 34 and are converted to steady state voltages and compared against each other by the sense amplifier 32 thereby making the current flowing through the MTJ 14 flow therethrough for small time intervals to avoid read disturbance to the MTJ 14. The MTJ 14 is sensed or read through the voltage difference sensed by the sense amplifier 32 because the each of the MTJs, such as the MTJ 14, acts as a resistance. This process is the same when reading the MTJ 16 or any of the MTJs of the array 10.

In accordance with a method reading the MTJ 14, a sequence of short current pulses is applied to the MTJ 14, and the applied sequence of short current pulses is converted to a sequence of short voltage pulses, and the sequence of short voltage pulses is converted into voltages sensible by the sense amplifier 32. Using the sense amplifier 32, the accumulated sequence of short voltage pulses is sensed and the state of the MTJ 14 is sensed based on the sensed sequence of short voltage pulses as it relates to the resistance of the MTJ 14. The MTJ 14 acts as a resistor and in this respect, the state of the MTJ 14 is determined by the current flowing therethrough and the voltage thereof.

Figure 2:
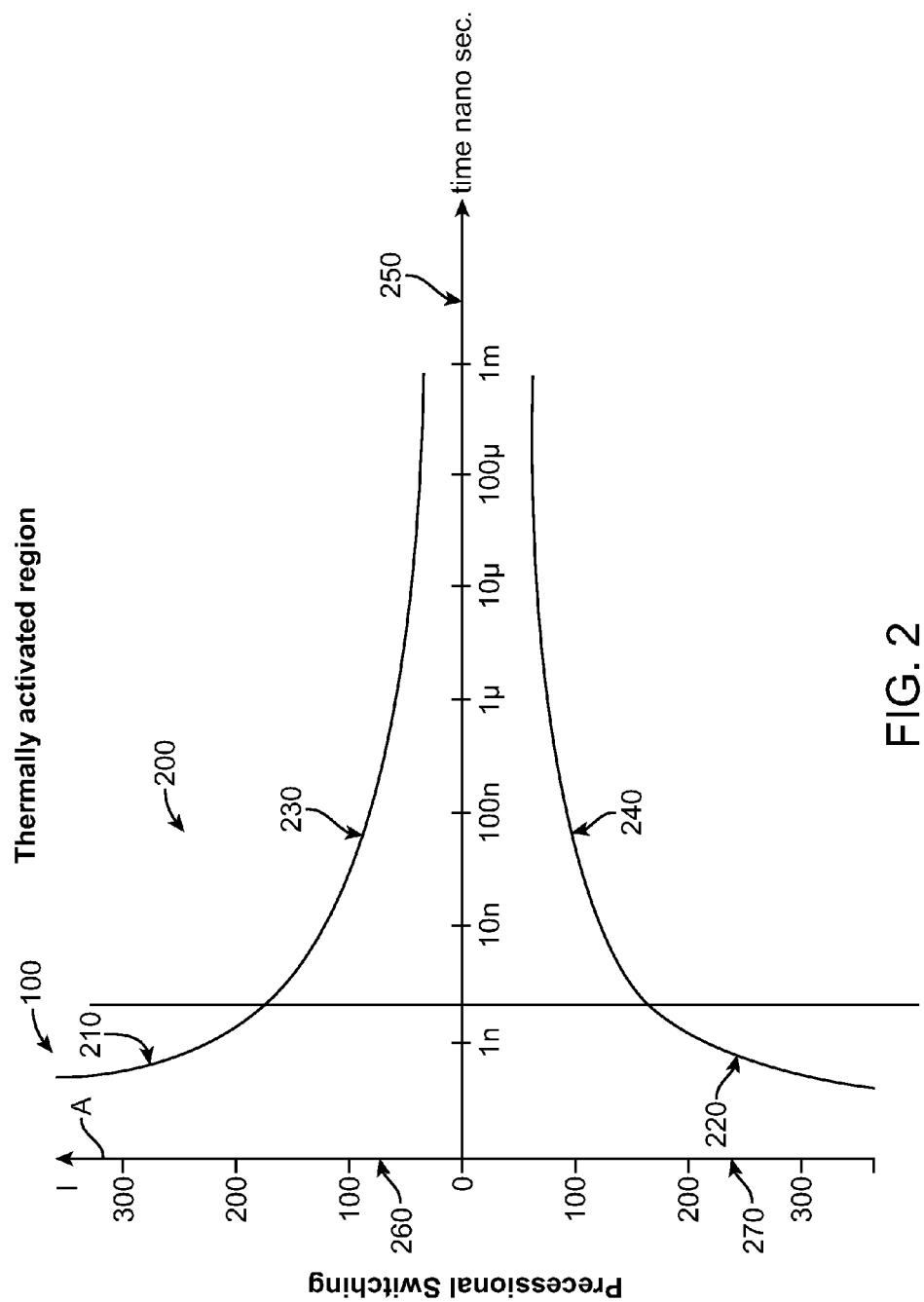
FIG. 2 shows a graph of the current (I), in micro Amps (uA) in the y-axis, required to program the MTJs 14 and 16 of FIG. 1, versus time, shown in nano seconds (ns) in the x-axis.

FIG. 2 shows a graph of the current (I), in micro Amps (uA) in the y-axis, required to program the MTJs 14 and 16 of FIG. 1, versus time, shown in nano seconds (ns) in the x-axis. As discussed below, a small short pulses are applied during a read operation with these small short pulses being very short in duration and while applied during the read operation, applied in essentially a processional switching region 100 of the MTJ being read, which requires very high programming current and reduces the possibility of accidental programming and read disturbance.

In FIG. 2, the graph 230 and the graph 240 are each graphs of the programming current "I" (y-axis), which is logarithmically proportional to time (x-axis). In FIG. 2, the programming currents increase substantially below 5 ns. In the region 100, current changes at a rate relative to time that is different than the rate at which the programming current changes in other regions, such as shown at 200 in FIG. 2. 200 generally shows a thermally-activated region where the MTJ programming is thermally activated and as a result current requirement for programming is logarithmically related to time, and it could switch erroneously during the read operation. However, the region 100 is free from such undesirable effect and for this reason, in the embodiments and methods of this invention, the MTJ to be read is made to operate in the region 100.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic random access memory (MRAM) array comprising:
   a magnetic tunnel junction (MTJ) to be read using a magnetic state of the MTJ, the MTJ being read by applying a current therethrough;
   a reference MTJ;
   a sense amplifier coupled to the MTJ and the reference MTJ, the sense amplifier operable to compare the voltage of the MTJ to the reference MTJ in determining the state of the MTJ;
   a first capacitor coupled to the sense amplifier at a first end and to ground at a second end; and
   a second capacitor coupled to the sense amplifier at a first end and to ground at a second end,
   wherein a sequence of short voltage pulses are applied to the first end of each of the first and second capacitors when reading the MTJ thereby making the current flowing through the MTJ flow therethrough for small time intervals and avoiding read disturbance to the MTJ.

2. The MRAM array of claim 1 wherein the MTJ and the reference MTJ are operable to perform in the processional switching region during reading of the MTJ.

3. The MRAM array of claim 1 wherein the MRAM array includes more than one MTJ to be read and more than one reference MTJ that is a counterpart of the MTJ to be read.

4. The MRAM array of claim 3 further including a first reference access transistor coupled to the MTJ to be read and having a gate coupled to a first word line, the first word line causing selection of the MTJ to be read through the first access transistor.

5. The MRAM array of claim 1 further including a first reference access transistor coupled to the reference MTJ and having a gate coupled to the first word line, the first word line causing selection of the reference MTJ through the first reference access transistor.

6. The MRAM array of claim 1 further including a first, second, third, and fourth transistors, the first transistor coupled to the MTJ to be read, the second transistor coupled to the MTJ to be read and the sense amplifier, the third transistor coupled to the reference MTJ, and the fourth transistor coupled to the reference MTJ and the sense amplifier.

7. The MRAM array of claim 1 wherein the first capacitor and second capacitor each are operable to convert the sequence of short voltage pulses to a respective steady state voltage allowing the sense amplifier to determine the voltage of the MTJ and that of the reference MTJ in determining the state of the MTJ.

8. The method of claim 7 wherein the MTJ and the reference MTJ are performing in the processional switching region during reading of the MTJ.

9. The method of claim 7 further including the step of selecting the MTJ to be read through the first access transistor.

10. The method of claim 8 wherein selecting the MTJ to be read is performed through the first reference access transistor.

11. The method of claim 1 further including the step of accumulating the sequence of voltage pulses.

12. A method of reading a magnetic tunnel junction (MTJ) of a magnetic random access memory (MRAM) array comprising:
   applying a sequence of short current pulses to a MTJ to be read;
   converting the applied sequence of short current pulses to a sequence of short voltage pulses;
   accumulating the sequence of short voltage pulses into voltages that are sensible by a sense amplifier, the sense amplifier being coupled to the MTJ to be read;
   using the sense amplifier, sensing the accumulated sequence of short voltage pulses; and
   determining the state of the MTJ to be read based on the sensed sequence of short voltage pulses as it relates to the resistance of the MTJ to be read.

* * * * *